(12) United States Patent
Figueroa

(10) Patent No.: US 6,672,912 B2
(45) Date of Patent: *Jan. 6, 2004

(54) DISCRETE DEVICE SOCKET AND METHOD OF FABRICATION THEREFOR

(75) Inventor: David G. Figueroa, Mesa, AZ (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/540,707

(22) Filed: Mar. 31, 2000

(65) Prior Publication Data

US 2002/0132533 A1 Sep. 19, 2002

(51) Int. Cl.[7] .................................................. H01R 4/18
(52) U.S. Cl. ........................... 439/862; 439/72; 439/525
(58) Field of Search ............................... 439/70, 71, 72, 439/73, 525, 862; 29/845

(56) References Cited

U.S. PATENT DOCUMENTS

| | | | | |
|---|---|---|---|---|
| 4,354,729 A | * | 10/1982 | Grabbe et al. | 439/733.1 |
| 4,623,208 A | * | 11/1986 | Kerul et al. | 439/266 |
| 4,645,279 A | * | 2/1987 | Grabbe et al. | 439/68 |
| 4,699,593 A | * | 10/1987 | Grabbe et al. | 439/71 |
| 4,726,739 A | | 2/1988 | Saitou et al. | 417/286 |
| 4,940,432 A | * | 7/1990 | Consoli et al. | 439/862 |
| 4,959,029 A | * | 9/1990 | Grabbe | 439/862 |
| 5,035,629 A | * | 7/1991 | Matsuoka | 439/70 |
| 5,286,208 A | * | 2/1994 | Matsuoka | 439/72 |
| 5,451,165 A | | 9/1995 | Cearley-Cabbiness et al. | 439/71 |
| 5,545,045 A | * | 8/1996 | Wakamatsu | 439/70 |
| 5,800,184 A | * | 9/1998 | Lopergolo et al. | 439/66 |
| 6,075,285 A | | 6/2000 | Taylor et al. | 257/691 |

OTHER PUBLICATIONS

Cotton, M., "Microfeatures & Embedded Coaxial Technology", *Electronic Circuits World Convention 8*, 6 p., (Sep. 8, 1999).

* cited by examiner

Primary Examiner—P. Austin Bradley
Assistant Examiner—Edwin A. León
(74) Attorney, Agent, or Firm—Schwegman, Lundberg, Woessner & Kluth, P.A.

(57) ABSTRACT

An integrated circuit socket includes one or more cavities formed in a top surface of the socket, where the one or more cavities are formed in a region over which an integrated circuit can be placed. Multiple conductive contacts are attached to the socket, where each contact includes a first member that extends into one of the cavities, and a second member that provides at least part of a conductive path between the first member and the socket. The first member at least partially holds in place a discrete device inserted into the cavity. An integrated circuit package or interposer attached to the top surface over the cavity also can at least partially hold the discrete device in place. The first member makes electrical contact with the discrete device, thus completing a conductive path between the discrete device and the integrated circuit.

15 Claims, 9 Drawing Sheets

DISCRETE DEVICE SOCKET AND METHOD OF FABRICATION THEREFOR

TECHNICAL FIELD OF THE INVENTION

The present invention relates generally to apparatus and fabrication methods for electrically connecting a discrete device to an integrated circuit, and more particularly to apparatus and fabrication methods for providing capacitance to an integrated circuit using discrete capacitors attached to a socket.

BACKGROUND OF THE INVENTION

Electronic circuits, and particularly computer and instrumentation circuits, have in recent years become increasingly powerful and fast. As circuit frequencies delve into the gigahertz region, with their associated high frequency transients, noise in the DC power and ground lines increasingly becomes a problem. This noise can arise due to inductive parasitics, for example, as is well known. To reduce such noise, capacitors known as decoupling capacitors are often used to provide a stable signal or stable supply of power to the circuitry.

Capacitors are further utilized to dampen power overshoot when an electronic device, such as a processor, is powered up, and to dampen power droop when the electronic device begins using power. For example, a processor that begins performing a calculation may rapidly need more current than can be supplied by available on-chip capacitance. In order to provide such capacitance and to dampen the power droop associated with the increased load, off-chip capacitance should be available to respond to the current need within a sufficient amount of time. If insufficient current is available to the processor, or if the response time of the capacitance is too slow, the die voltage may collapse.

Decoupling capacitors and capacitors for dampening power overshoot or droop are generally placed as close to the load as practical to increase the capacitors' effectiveness. Often, these capacitors are surface mounted to the electronic device or the package substrate on which the device is mounted. In some cases, the capacitors can be mounted to the die side of the package (i.e., the top side of the package where the die is mounted), the land side of the package (i.e., the bottom side of the package), or both. FIG. 1 illustrates a cross-sectional view of an integrated circuit package 102, upon which a die 104, die side capacitors 106, and land side capacitors 108 are mounted. Opposing leads of capacitors 106, 108 are electrically connected, via conductive paths (not shown) in package 102, to one or more die loads (not shown). These capacitors 106, 108 provide capacitance for noise, power overshoot, and power droop dampening.

FIG. 2 illustrates an electrical circuit that simulates the electrical characteristics of the capacitors illustrated in FIG. 1. The circuit shows a die load 202, which may require capacitance or noise dampening in order to function properly. Some of the capacitance can be supplied by capacitance 204 located on the die. Other capacitance, however, must be provided off chip, as indicated by off-chip capacitor 206. The off-chip capacitor 206 could be, for example, either or both the die side or land side capacitors 106, 108 illustrated in FIG. 1. The off-chip capacitor 206 may more accurately be modeled as a capacitor in series with some resistance and inductance. For ease of illustration, however, off-chip capacitance 206 is modeled as a simple capacitor.

The off-chip capacitor 206 must be located some distance from die load 202 due to manufacturing constraints. Accordingly, some inductance 208 exists between the die load and the off-chip capacitance. Because the inductance 208 tends to slow the response time of the off-chip capacitor 206, it is desirable to minimize the distance between the off-chip capacitance 206 and the die load 202, thus reducing the inductance value 208. This can be achieved by placing the off-chip capacitor 206 as close as possible to the die load.

Land side capacitors 108 (FIG. 1) can be placed directly underneath a die on the bottom side of a package. Thus, in some cases (although not all), the electrical distance between land side capacitors 108 and a die load can be significantly shorter than can the path between die side capacitors 106 (FIG. 1) and a die load. This means that, often times, better performance can be achieved using land side capacitors 108 to provide the needed decoupling, rather than using die side capacitors 106, which may be less effective.

Unfortunately, many applications, such as mobile applications, use packages where the input/output (I/O) leads to the die are centrally located and densely dispersed in an area directly underneath the die, referred to as the "I/O ring." For example, land grid array and ball grid array packages include numerous I/O leads on the bottom side of the package within the I/O ring. In such applications, it is not practical to place the decoupling capacitors on the bottom side of the package under the die, because the capacitors would interfere with the physical and electrical connection of the package with the circuit board upon which it is to be mounted.

As electronic devices continue to advance, there is an increasing need for higher levels of capacitance at reduced inductance levels for decoupling, power dampening, and supplying charge. Accordingly, there is a need in the art for alternative capacitance solutions in the fabrication and operation of electronic and integrated circuit packages.

DETAILED DESCRIPTION OF THE INVENTION

Various embodiments of the present invention provide a socket (referred to herein as an "integrated circuit socket") for connecting an integrated circuit package or an interposer to a printed circuit board (e.g., a mother board). The socket has one or more cavities and electrical contacts for holding discrete devices, such as capacitors, resistors, inductors, transistors, memory devices, and other devices, for example. Used in conjunction with a discrete capacitor, the configuration allows low-inductance, decoupling capacitance to be provided to the integrated circuit, thus effectively suppressing noise, dampening power overshoot and droop, and supplying charge to die hot spots in a timely manner. In one embodiment, cavities are formed in an integrated circuit socket within the region defined by the I/O ring. Electrical contacts are inserted into or connected to the socket, where a portion of each contact extends into the cavity. A discrete device is inserted into the cavity and placed in electrical contact with one or more of the contacts. The contacts hold the device in place underneath the integrated circuit package or interposer, and also provide a conductive path between the device and the socket.

Figure 1:
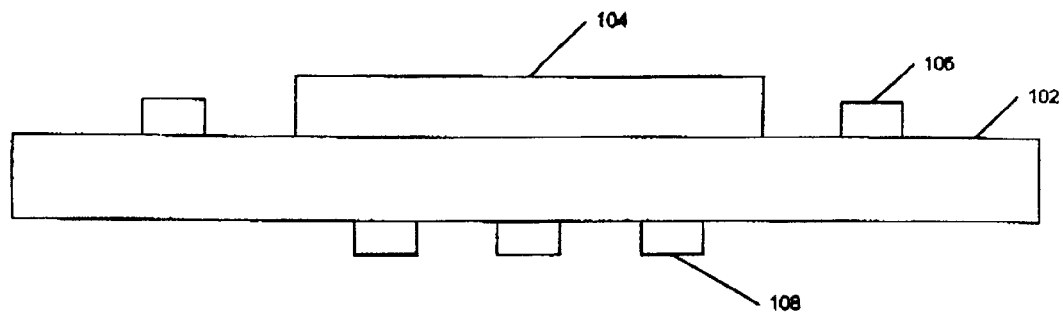
FIG. 1 illustrates a cross-sectional view of an integrated circuit package, upon which a die, die side capacitors, and land side capacitors are mounted in accordance with the prior art.
Figure 2:
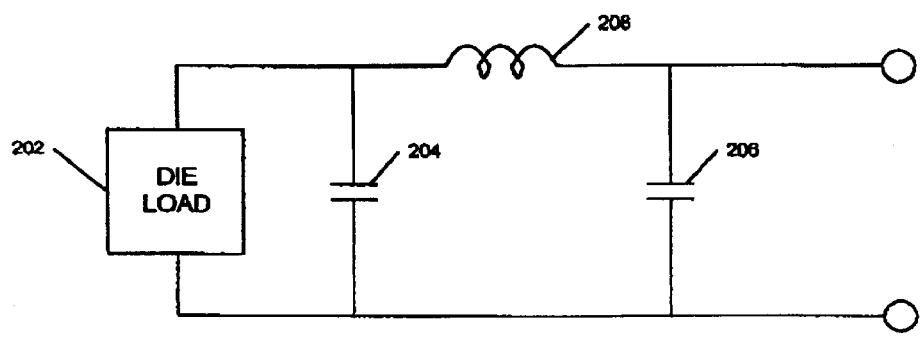
FIG. 2 illustrates an electrical circuit that simulates the electrical characteristics of the capacitors illustrated in FIG. 1.
Figure 3:
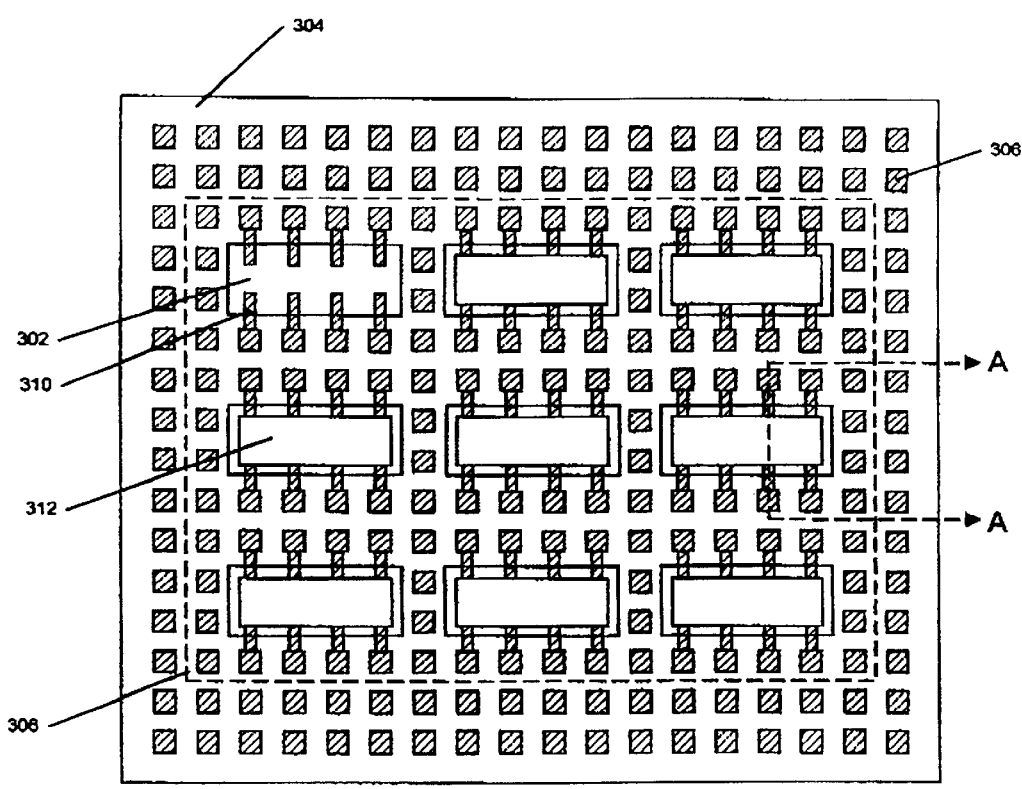
FIG. 3 illustrates a top view of a series of discrete device sockets within an integrated circuit socket in accordance with one embodiment of the present invention.

FIG. 3 illustrates a top view of a series of discrete device sockets 302 within a land grid array socket 304 in accordance with one embodiment of the present invention. Although a land grid array socket 304 is illustrated and described herein, the method and apparatus of the present invention could be used in conjunction with other packaging technologies, including but not limited to, ball grid array and pin grid array technologies, among others.

Integrated circuit sockets, such as socket 304, include electrically conductive interconnect structures between the top surface of the socket and the bottom surface of the socket. Some of the interconnect structures terminate on a top surface of the socket 304 at a conductive pin head or landing pad 306. A group of such pin heads or pads 306 that fall within a region over which an integrated circuit package or interposer can be placed is referred to herein as the "I/O ring" 308. Pin heads or pads 306 within the I/O ring may provide 110 signals, power, and ground to the integrated circuit.

In one embodiment, one or more cavities 302 are formed in a top surface of socket 304. In one embodiment, cavities 302 are disposed substantially within the I/O ring 308, and thus underneath a die. Cavities 302 may be dispersed evenly throughout I/O ring 308, or concentrations of cavities could be provided to produce additional capacitance for the die hot spots, for example.

In various embodiments, cavities 302 can be holes through all layers of socket 304 or they can be depressions in socket 304 that are bounded on the bottom by one or more layers of socket 304. Each cavity 302 is sized to accommodate portions of one or more contacts 310. As will be described later, each contact 310 includes a first member of conductive material that extends into a cavity 302, and a second member of conductive material that provides part of a conductive path between the first member and at least one of the levels of conductive material within the socket 304. The second member either connects to a landing pad 306, or includes a pin 306 that extends into the socket 304.

Contacts 310 can be formed from a conductive material such as copper, for example, although other conductive metals such as tin, lead, nickel, gold, and palladium could also be used in various embodiments. In one embodiment, each contact 310 is formed of a material that has a spring coefficient that is sufficient to bend and compress against a discrete capacitor 312 or other device when the capacitor 312 or device is inserted into cavity 302. In this manner, contacts 310 serve the function of at least partially holding the discrete capacitor 312 in place by making contact with a side surface of the discrete capacitor 312. In one embodiment, at least some of contacts 310 make contact with the terminals of discrete capacitor 312, thus completing an electrical path between the discrete capacitor 312 and socket 304.

FIG. 3 illustrates nine cavities 302 dispersed within I/O ring 308. In various embodiments, more or fewer cavities 302 may be formed in socket 304. In addition, although only one capacitor 312 is placed within each cavity 302, more or fewer discrete capacitors 312 could be placed within each cavity 302. Further, one or more cavities 302 could be formed outside I/O ring 308 in various embodiments. In addition, although eight contacts 310 are shown within each cavity 302, more or fewer contacts 310 could extend into each cavity 302. The orientation of cavities 302 and pin heads or landing pads 306 could be substantially different from the example orientation shown in FIG. 3, in various embodiments. In addition, the relative dimensions of the cavities 302 are for illustration purposes only. In reality, these dimensions would likely be different from those shown in FIG. 3.

Figure 4:
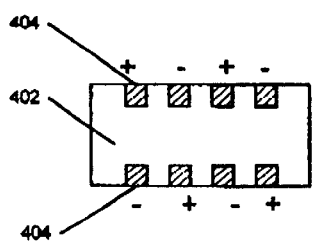
FIG. 4 illustrates a top view of an eight-terminal discrete capacitor.
Figure 5:
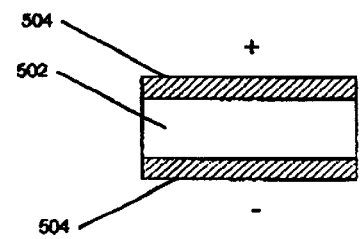
FIG. 5 illustrates a top view of a two-terminal discrete capacitor.

The size and shape of cavities 302, and the orientation and number of contacts 310 within each cavity 302 could be adjusted to accommodate various different types of discrete capacitors 312 or other devices. FIGS. 4 and 5 illustrate two different types of discrete capacitors that could be accommodated by cavities 302, although numerous other types of discrete capacitors (not shown) also could be accommodated in various embodiments.

FIG. 4 illustrates a top view of an eight-terminal discrete capacitor 402. Capacitor 402 includes eight terminals 404, which provide electrical connections to positive and negative leads of a capacitive structure (not shown) within capacitor 402. Referring again to FIG. 3, when capacitor 402 is inserted into cavity 302, terminals 404 come into physical contact with some or all of contacts 310. Thus, by inserting capacitor 402 into cavity 302, an electrical path is established between capacitor 402 and socket 304.

Although capacitor 402 includes eight terminals 404, it may include only a single capacitive structure. The polarity of terminals 404 alternates between positive and negative, with each of the positive and negative terminals 404 connecting to the positive and negative leads, respectively, within capacitor 402. A package designer would design the interconnect levels and contact placement within socket 304 so that they make the appropriate electrical contact with terminals 404.

FIG. 5 illustrates a top view of a two-terminal discrete capacitor 502, which also could be used in conjunction with various embodiments of the present invention. Capacitor 502 includes two terminals 504, which provide electrical connections to positive and negative leads of a capacitive structure (not shown) within capacitor 502. Similar to capacitor 402 described in conjunction with FIG. 4, when capacitor 502 is inserted into cavity 302 (FIG. 3), terminals 504 come into physical contact with some or all of contacts 310. Thus, by inserting capacitor 502 into cavity 302, an electrical path is established between capacitor 502 and socket 304. Because capacitor 502 includes only two terminals, the number of contacts 310 used in cavity 302 could be reduced to as few as two contacts 310, where one contact 310 would make contact with each of the positive and negative terminals 504.

FIGS. 4 and 5 are intended to show two types of discrete capacitors that could be used in conjunction with various embodiments of the present invention. These examples are not intended to be limiting in any sense, as one of skill in the art would understand, based on the description herein, that numerous different types of discrete capacitors or other discrete devices could be used. Specifically, capacitors or other devices having more or fewer terminals and having different shapes and relative sizes could be used. In addition, capacitors that include more than one internal capacitive structure also could be used. It is to be understood that the number of terminals on the discrete capacitor or device can be different from the number of contacts 302 (FIG. 3) used to hold the discrete capacitor or device in place. This means that more or fewer contacts 302 than discrete device terminals could be used, in various embodiments.

Figure 6:
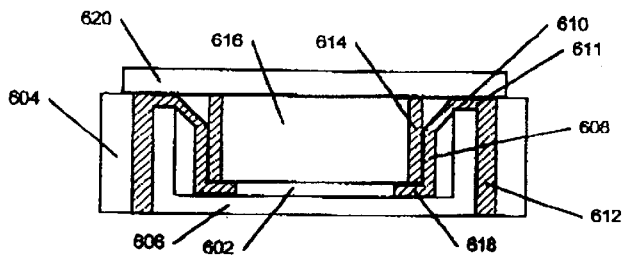
FIG. 6 illustrates a cross-sectional view of a discrete device socket along section lines A—A of FIG. 3 in accordance with one embodiment of the present invention.

The discrete device socket and contacts will now be described in more detail. FIG. 6 illustrates a cross-sectional view of a discrete device socket along section lines A—A of FIG. 3 in accordance with one embodiment of the present invention. The socket is formed from a cavity 602 within one or more layers of an integrated circuit socket. The cavity may be a hole through all layers of the socket 604, or it may be a depression that is bounded on the bottom by one or more layers 606 of the socket 604.

Extending into the cavity 602 is a first member 608 of an electrical contact. The first member 608 connects to a second member 610. Both first member 608 and second member 610 are formed from a conductive material, such as copper, tin, lead, nickel, gold, palladium, or other conductive materials, for example.

The second member 610 includes a bridge member 611 that forms at least part of a conductive path between the first member and interconnect structure 612. Interconnect structure 612 can be a pin, for example, or a region of deposited conductive material within a socket via. Interconnect structure 612 can form a part of second member 610, or it can be a separate conductive member to which second member 610 is attached. When interconnect structure 612 forms a part of second member 610, structure 612 is a pin, in one embodiment. The pin may be a compression fit pin, in one embodiment, although it could be a regular pin in another embodiment.

Interconnect structure 612 provides an electrical connection between the top and bottom surfaces of socket 604. In this manner, first member 608, second member 610, and interconnect structure 612 complete a conductive path between terminals 614 of a discrete capacitor 616 or other device and the top and bottom surfaces of socket 604.

Discrete capacitor 616 is at least partially held in place by first member 608, which makes contact with a side surface of discrete capacitor 616. When first member 608 makes contact with a terminal 614, first member 608 also makes electrical contact with discrete capacitor 616. In this manner, first member 608 may be used to provide both physical contact with capacitor 616, and in some cases electrical contact as well.

In one embodiment, first member 608 includes a lower flange 618, which is connected to and forms a rim toward the end of first member 608 opposite second member 610. When capacitor 616 is inserted, flange 618 is substantially parallel to and supports a portion of the bottom surface of capacitor 616. In this manner, flange 618 at least partially holds capacitor 616 in place by making contact with the bottom surface of capacitor 616. In another embodiment, first portion 608 may not include a lower flange. In one embodiment, capacitor 616 may also be partially held in place by an integrated circuit package 620, interposer, or other rigid material, which makes contact with a top surface of capacitor 616, when package 620 is attached to the top surface of socket 604.

Figure 7:
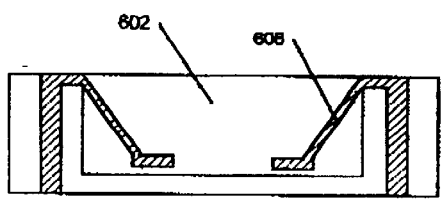
FIG. 7 illustrates a cross-sectional view of the discrete device socket shown in FIG. 6 without a capacitor inserted in the socket in accordance with one embodiment of the present invention.

FIG. 7 illustrates a cross-sectional view of the discrete device socket shown in FIG. 6 without a device inserted in the socket in accordance with one embodiment of the present invention. A comparison of FIGS. 6 and 7, shows that first member 608 bends when capacitor 616 (FIG. 6) is inserted into cavity 602. Accordingly, in one embodiment, first member 608 is formed of a material that has a spring coefficient that is sufficient to bend and compress against capacitor 616 when capacitor 616 is inserted into cavity 602.

Figure 8:
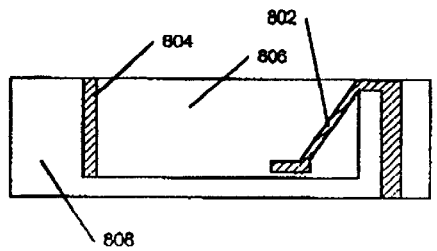
FIG. 8 illustrates a cross-sectional view of a discrete device socket without a capacitor inserted in the socket in accordance with another embodiment of the present invention.

FIG. 8 illustrates a cross-sectional view of a discrete device socket without a device inserted in the socket in accordance with another embodiment of the present invention. In this embodiment, the capacitor 616 (FIG. 6) would be held in place by first member 802, and also by a conductive material 804 disposed on a sidewall of cavity 806. In various embodiments, conductive material 804 could be made of copper, tin, lead, nickel, gold, palladium or some other conductive material. The conductive material 804 would electrically couple a discrete capacitor with the top and bottom surfaces of socket 808.

Figure 9:
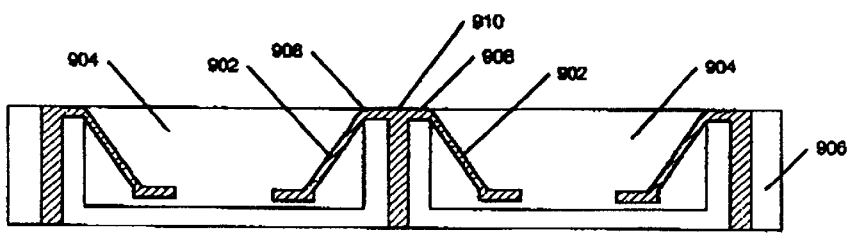
FIG. 9 illustrates a cross-sectional view of a two-terminal contact in accordance with another embodiment of the present invention.

Referring back to FIG. 6, a single contact formed from a first member 608 and a second member 610 is illustrated, where the contact forms at least part of a conductive path to the top and bottom surfaces of socket 808 through interconnect structure 612. In another embodiment, multiple first and second members can be coupled to a single interconnect structure 612. Such an alternate embodiment is shown in FIG. 9, which illustrates a cross-sectional view of a two-terminal contact.

The two terminal contact includes two first members 902 which extend into adjacent cavities 904 within a socket 906. The first members 902 are connected via two second members 908 and a single interconnect structure 910. Interconnect structure 910 can form a part of second members 908, or second members 908 can be attached to interconnect structure 910. FIG. 9 illustrates that a two terminal contact can be used to provide electrical connection with two discrete capacitors or other devices (not shown), rather than using two, single terminal contacts such as those shown in FIGS. 3, and 6–8. In various embodiments, any combination of two-terminal and single terminal contacts could be used in a single socket.

Figure 10:
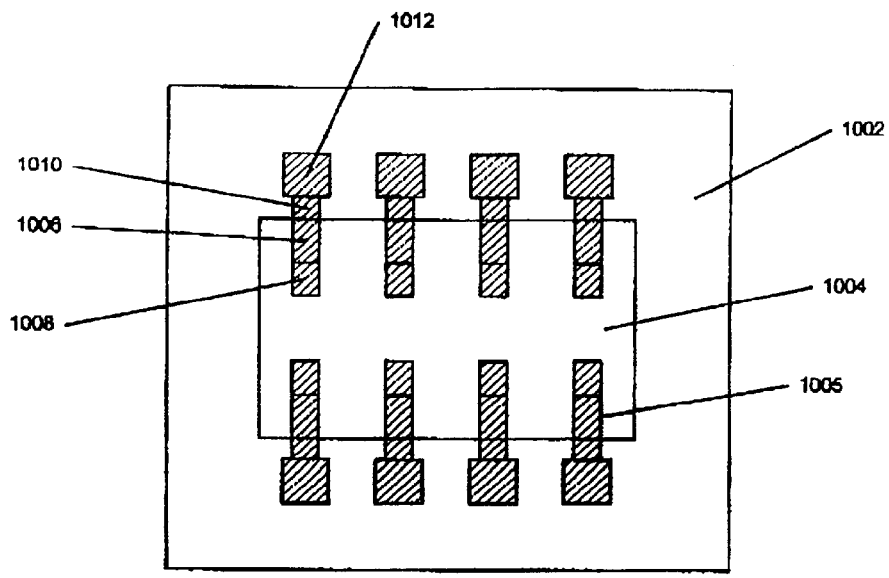
FIG. 10 illustrates a top view of a discrete device socket in accordance with one embodiment of the present invention.

The electrical contacts described above will now be described in more detail. FIG. 10 illustrates a top view of a discrete device socket disposed in a socket 1002 in accordance with one embodiment of the present invention. The socket includes a cavity 1004 into which portions of multiple contacts 1005 extend. Although eight contacts 1005 are shown in FIG. 10, more or fewer contacts may be used in various other embodiments.

As described previously, each contact includes a first member 1006, which may or may not include a lower flange 1008. In addition, each contact includes a second member 1010, which forms part of an electrical path between the first member 1006 and an interconnect structure (not shown) that extends into the socket 1002. As described previously, the interconnect structure may be a pin or it may be deposited conductive material.

When the interconnect structure is a pin, it is terminated on the top surface of the socket 1002 by a pin head 1012. In one embodiment, the pin is integrally connected with and forms a part of second member 1010. In another embodiment, second member 1010 is attached to pin head 1012. This attachment may be made, for example, using a solder or other connection that holds second member 1010 in contact with pin head 1012.

Although pin head 1012 is shown having a square shape in FIG. 10, pin head 1012 could have any of a number of other shapes, including circular, oval, rectangular, or hexagonal, for example. In addition, pin head 1012 may sit above the surface of socket 1002, or may fit within a depression on the top surface of socket 1002. When pin head 1012 fits within a depression, the complementary head shape and depression shape can function to orient and align the first member 1006 within cavity 1004.

When the interconnect structure is formed from deposited conductive material, it is terminated on the top surface of the socket 1002 by landing pad 1012. In this embodiment, second member 1010 is attached to landing pad 1012 using a solder or other connection.

Figure 11:
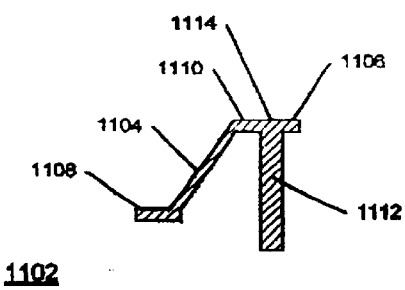
FIG. 11 illustrates a pin contact for electrically and physically connecting a discrete capacitor or other device to an integrated circuit socket in accordance with one embodiment of the present invention.

The contacts shown in FIG. 10 may be configured in various ways, in various embodiments, as is illustrated in FIGS. 11–14. FIG. 11 illustrates a pin contact 1102 for electrically and physically connecting a discrete capacitor or other device to a socket in accordance with one embodiment of the present invention. Pin contact 1102 includes a first member 1104 and a second member 1106, both made of a conductive material. In one embodiment, first member 1104 includes a lower flange 1108, although lower flange 1108 may be excluded in another embodiment.

Second member 1106 includes a bridge member 1110 and a pin 1112. Bridge member 1110 provides a conductive path between first member 1104 and pin 1112. Pin 1112 is designed to be inserted into a pin hole of a socket (not shown). In one embodiment, pin 1112 has a head 1114, which engages with a complementary depression in the socket, facilitating the alignment of contact 1102 in the socket.

Figure 12:
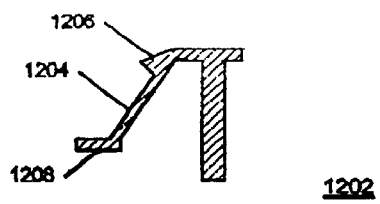
FIG. 12 illustrates a pin contact for electrically and physically connecting a discrete capacitor or other device to an integrated circuit socket in accordance with another embodiment of the present invention.

FIG. 12 illustrates a pin contact 1202 for electrically and physically connecting a discrete capacitor or other device to a socket in accordance with another embodiment of the present invention. Contact 1202 is similar to the pin contact shown in FIG. 11, except that the first member 1204 includes an upper flange 1206, which forms a rim toward an upper end of first member 1204.

After pin contact 1202 has been inserted into a socket and first member 1204 extends into a cavity, a discrete capacitor inserted into the cavity will make contact with upper flange 1206. Upper flange 1206 will then at least partially hold the discrete capacitor in place. In one embodiment, upper flange 1206 will contact an upper surface of the discrete capacitor, and in another embodiment, upper flange 1206 will contact a side surface of the discrete capacitor. First member 1204 also may include a lower flange 1208, although the lower flange 1208 may be excluded in another embodiment.

Figure 13:
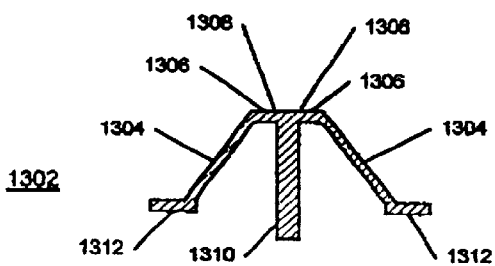
FIG. 13 illustrates a pin contact having two first members for electrically and physically connecting two discrete capacitors or other devices to an integrated circuit socket in accordance with another embodiment of the present invention.

FIG. 13 illustrates a pin contact 1302 having two first members for electrically and physically connecting two discrete capacitors or other devices to a socket in accordance with another embodiment of the present invention. Pin contact 1302 is similar to contact 1102 shown in FIG. 11, except that contact 1302 includes two first members 1304, which are attached to two bridge members 1306 of second members 1308. As described in conjunction with FIG. 9, a pin portion 1310 of pin contact 1302 can be inserted into a pin hole of a socket, causing first members 1304 to extend into two adjacent cavities. In various embodiments, pin contact 1302 may or may not include lower flanges 1312 and/or upper flanges (e.g., flange 1206, FIG. 12).

Figure 14:
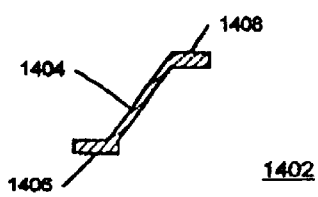
FIG. 14 illustrates a simple contact for electrically and physically connecting a discrete capacitor or other device to an integrated circuit socket in accordance with another embodiment of the present invention.

FIG. 14 illustrates a simple contact 1402 for electrically and physically connecting a discrete capacitor or other device to a socket in accordance with one embodiment of the present invention. Contact 1402 includes a first member 1404 and a second member 1408 connected to first member 1402. Essentially, second member 1408 functions as a bridge member that provides a conductive path between first member 1404 and a landing pad or a pin (not shown) on a socket. Accordingly, second member 1408 is attached to the landing pad or pin, using solder or some other conductive attachment. In various embodiments, contact 1402 may or may not include a lower flange 1410 and/or an upper flange (e.g., flange 1206, FIG. 12).

Figure 15:
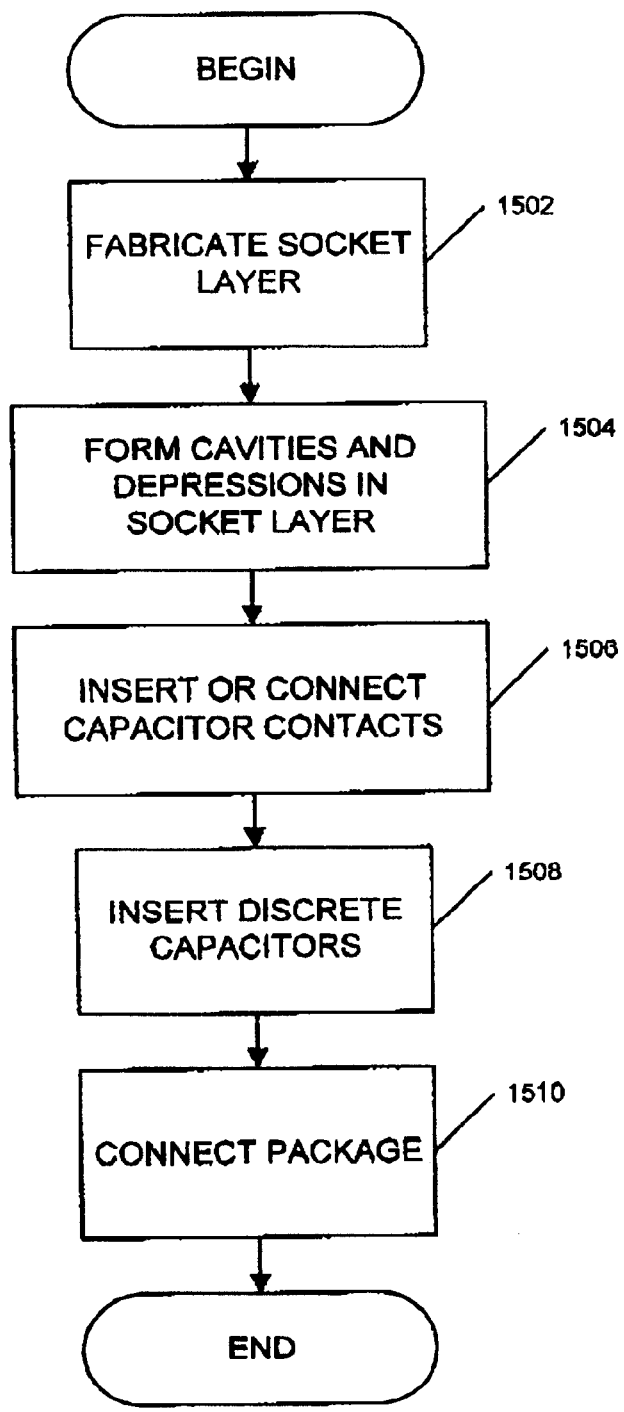
FIG. 15 illustrates a flowchart of a method for fabricating a discrete device socket in accordance with one embodiment of the present invention.

FIG. 15 illustrates a flowchart of a method for fabricating a discrete device socket in accordance with one embodiment of the present invention. FIG. 15 should be viewed in conjunction with FIGS. 16–20, which are schematic cross-sections illustrating various stages of fabricating a discrete device socket using a pinned contact (e.g., contacts 1102, 1202 or 1302, FIGS. 11–13) in accordance with one embodiment of the present invention.

Figure 16:
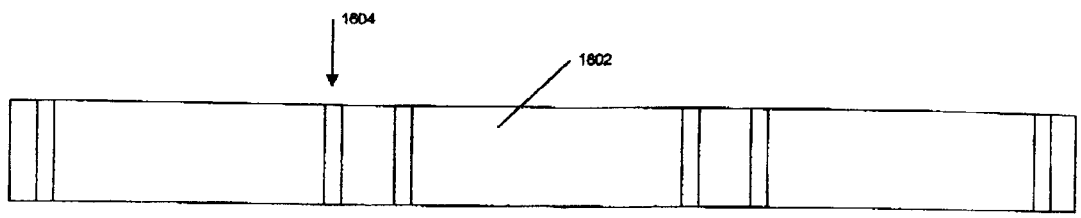
FIGS. 16–20 are schematic cross-sections illustrating various stages of fabricating a discrete device socket using a pinned contact in accordance with one embodiment of the present invention.

The method begins, in block 1502, by fabricating a socket layer 1602 (FIG. 16). As described previously, socket layer 1602 includes one or more pin holes 1604, each of which extends through the socket. Although pin holes 1604 are shown to extend through all levels of socket layer 1602, any or all of pin holes 1604 may extend through fewer than all the levels.

The socket layer can be fabricated using standard techniques known to those of skill in the art. Generally, the process begins by providing a substrate, which can be an organic substrate, such as an epoxy material, in one embodiment. For example, standard printed circuit board materials such as FR-4 epoxy-glass, polymide-glass, benzocyclobutene, Teflon, other epoxy resins, injection molded plastic or the like could be used in various embodiments. In alternate embodiments, the substrate could consist of an inorganic substance, such as ceramic, for example.

Standard procedures for building up levels of conductive or insulating layers can then be employed, thus creating a single or multiple level socket layer 1602. In various embodiments, the thickness of socket layer 1602 is within a range of about 10–1000 microns. Socket layer 1602 could consist of one or multiple levels of substrate material and patterned conductive material, where each level is within a range of about 10–40 microns in one embodiment. The substrate and its associated levels could be thicker or thinner than these ranges in other embodiments.

The pin holes 1604 are formed through one or more levels of the socket layer 1602. In various embodiments, the diameter of each pin hole 1604 is within a range of about 50–300 microns, with it being approximately 200 microns in one embodiment. In addition, the length of each pin hole 1604 could be in a range of about 10–1000 microns, depending on how many levels of socket layer 1602 each hole extends through. The diameters and lengths of holes could be larger or smaller than these ranges in other embodiments. Although pin holes 1604 are shown as through holes (i.e., holes through all layers of package layer 1602) in FIG. 16, each pin hole 1604 could be bounded below by various levels of socket layer 1602.

Pin holes 1604 are formed in a manner known in the art for forming an opening in a substrate. For example, in one embodiment, pin holes 1604 are mechanically drilled, although pin holes 1604 may also be punched, laser drilled or formed using other technologies in various other embodiments.

Referring back to FIG. 15, in block 1504, one or more cavities 1702 (FIG. 17) are formed in a top surface 1704 of socket layer 1602. Cavities 1702 may be holes through all levels of socket layer 1602, or they may be depressions formed through fewer than all the levels. When cavities 1702 are depressions, they are defined, in part, by a bottom layer 1706 of socket 1602.

In one embodiment, one or more depressions 1708, referred to herein as "bridge depressions," are also formed in the top surface 1704. Bridge depressions 1708, which are not as deep as cavities 1702, are formed between cavities 1702 and pin holes 1604. As will be described in more detail below, bridge depressions 1708 are complementary to the bridge members of contacts. In another embodiment, bridge depressions 1708 are not formed, and the contacts' bridge members instead overlie the top surface 1704 of socket 1602.

Formation of the cavities 1702 and/or bridge depressions 1708 could be performed, for example, using a common subtractive technology, such as chemical mechanical planarization to physically abrade away the material. Alternatively, a photo or laser imaging and etching process could be used. Other subtractive technologies could be used in other embodiments.

In still other embodiments, the cavities 1702 and/or bridge depressions 1708 could be formed during the build-up process, by not applying the various levels of material in the socket layer 1602 to the areas where the cavities and/or bridge depressions are to exist. In other words, rather than forming and selectively removing portions of the socket layer 1602, cavities 1702 and/or bridge depressions 1708 could be formed by selectively adding the desired portions of the conducting and non-conducting levels of socket layer 1602. In other embodiments, cavities 1702 and/or bridge depressions 1708 could be formed before pin holes 1604.

The relative dimensions of each cavity 1702 will vary depending on the size of the capacitor or other device that will be inserted into cavity 1702. Essentially, each cavity 1702 must be large enough to accommodate the capacitor and those portions of the pin contacts that extend into the cavity 1702. Thus, each cavity 1702 is some percentage greater in size than the size of the capacitor. In various embodiments, each cavity is in a range of about 105% to 130% of the length, width, and depth of the capacitor or other device that is intended to be inserted therein. In other embodiments, the cavities can be larger or smaller than this range.

If socket layer 1602 is an inorganic substance, such as ceramic, other hole, cavity, and bridge depression formation techniques known to those of skill in the art would be used. For example, socket layer 1602 could be created with pin holes 1604, cavities 1702, and depressions 1708 already existing therein. Either way, blocks 1502 and 1504 (FIG. 15) result in the fabrication of a socket layer 1602 having a top surface 1704 through which one or more holes 1604, cavities 1702, and depressions 1708 are formed.

Figure 17:
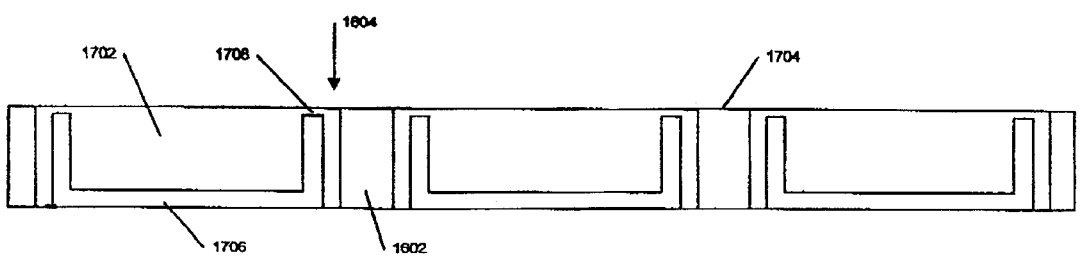
Figure 18:
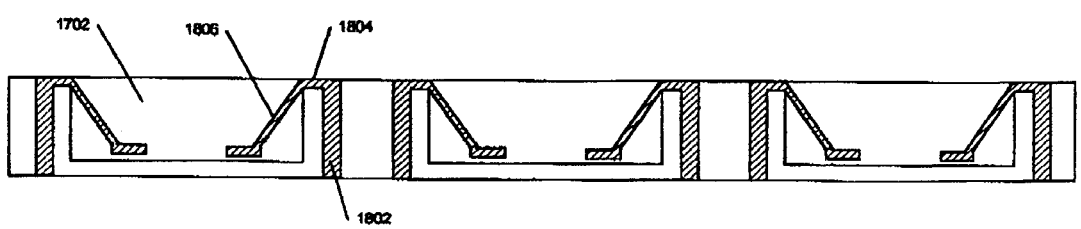
Figure 19:
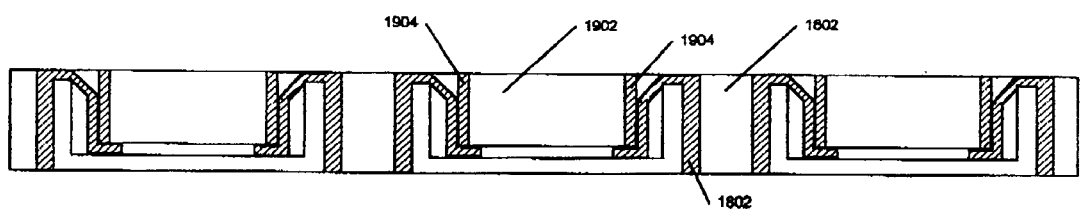
Figure 20:
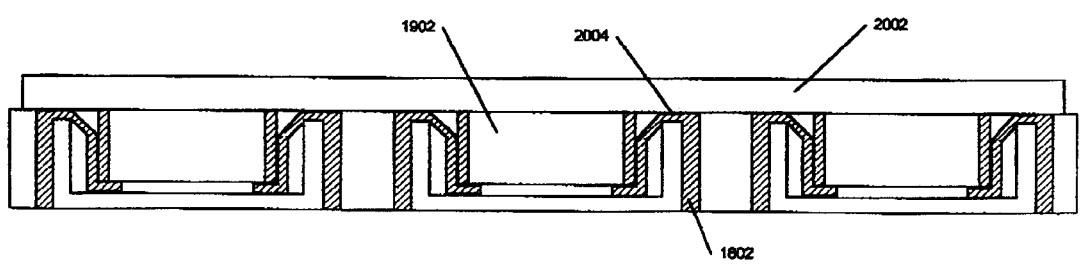

Referring back to FIG. 15, in block 1506, the pin portions of one or more contacts 1802 (FIG. 18) are inserted into the pin holes 1604, in one embodiment. Properly inserted, the bridge members 1804 of contacts 1802 insert into bridge depressions 1708 (FIG. 17). In addition, the first members 1806 of contacts 1802 extend into cavities 1702. In various embodiments, different types of contacts having pin portions can be inserted into the pin holes, such as the contacts shown in FIGS. 11–13, for example, and variations thereof. These pins may terminate at the bottom surface of the socket, or may extend beyond the bottom surface, being insertable into a PC board (not shown).

After the contacts 1802 have been inserted, discrete capacitors 1902 (FIG. 19) or other devices are inserted into the cavities, in block 1508. In this manner, the capacitor's terminals 1904 come into contact with at least some of contacts 1802, and a conductive path is created between capacitor 1902 and the socket 1602.

Finally, in block 1510, an integrated circuit package 2002 (FIG. 20), interposer, or other rigid material is provided and electrically connected to pins and/or landing pads 2004 on the top surface of the socket. Package 2002 can be connected, for example, by depositing solder bumps on the pins and/or landing pads 2004, and/or on pads (not shown) on package 2002, and reflowing the solder once the die 2202 is arranged over the corresponding pins and/or landing pads. Alternatively, the package can be compression fit to the top of the socket. For example, a retention mechanism can be placed on the package, and screws can be applied through the mechanism, package, socket, and into a PC board upon which the socket is mounted.

In one embodiment, package 2002 serves the function of at least partially holding capacitors 1902 in place by making contact with the top surface of the capacitor 1902. In one embodiment, package 2002 includes an integrated circuit, and by electrically connecting package 2002 to the socket, a conductive path is established between various die loads (not shown) within the integrated circuit and the discrete capacitors 1902, via contacts 1802.

Figure 21:
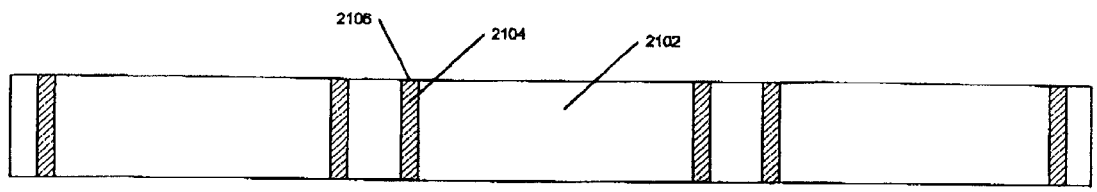
FIGS. 21–23 are schematic cross-sections illustrating various stages of fabricating a discrete device socket using a simple contact in accordance with another embodiment of the present invention.
Figure 22:
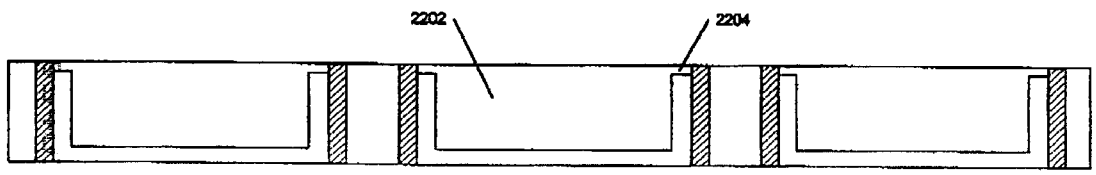
Figure 23:
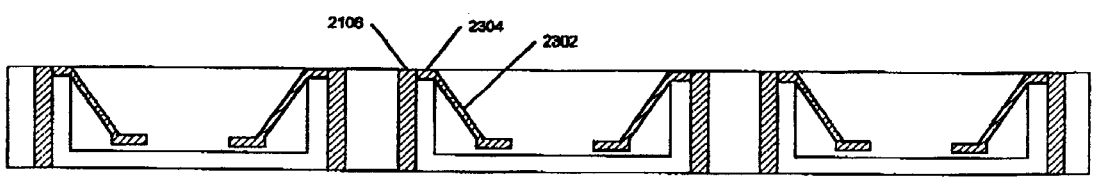

The various stages of assembly described above pertain to an embodiment of the invention that uses pinned contacts. These contacts may include compression fit pins or regular pins. In another embodiment, a simple contact, such as that shown in FIG. 14, also may be used. FIGS. 21–23 are schematic cross-sections illustrating various stages of fabricating a discrete device socket using a simple contact in accordance with another embodiment of the present invention. The fabrication process generally is the same as the process described in conjunction with FIGS. 15–20, with some variations that are described, below.

Referring again to FIG. 15, the process begins, in block 1502, by fabricating a socket layer 2102 (FIG. 21). This process is generally the same as the process described in conjunction with FIG. 16, except that pin holes for the contacts need not be formed. Instead, conductive traces 2104 are embedded within the socket layer 2102, terminating at landing pads 2106 on the top surface 2108 of the socket. Traces 2104 make contact with the bottom surface of socket layer 2102.

Next, in block 1504, cavities 2202 (FIG. 22) are formed in the top surface, using methods described in conjunction with FIG. 17. In addition, in one embodiment, bridge depressions 2204 are also formed using methods described above.

In block 1506, contacts 2302 (FIG. 23) are then connected to landing pads 2106. In one embodiment, this is done by inserting the bridge member 2304 of contact 2302 into the bridge depression 2204 (FIG. 22), and then soldering or otherwise attaching the bridge member 2304 to the landing pad 2106. Blocks 1508 and 1510 can then be performed, as described in conjunction with FIGS. 19–20.

Although various cavity, depression, pin, and contact sizes and locations are illustrated with specific relative dimensions, the relative dimensions and locations of these elements can be varied during the design process to accommodate various types of capacitors or other devices.

In the embodiments shown above, various loads on the die are provided with an additional source of off-chip capacitance (i.e., the discrete capacitors). When a portion of the die, referred to as a die "hot spot," needs a very large amount of current, the first charge that will respond to the current need will come from the capacitance on the die. Next, charge will be provided by the discrete capacitors inserted into the socket cavities.

Figure 24:
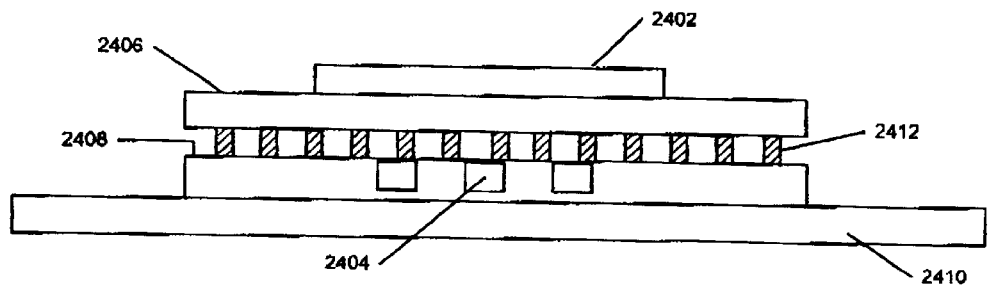
FIG. 24 illustrates an integrated circuit socket that includes one or more discrete device sockets in accordance with one embodiment of the present invention.

FIG. 24 illustrates an integrated circuit socket that includes one or more discrete device sockets in accordance with one embodiment of the present invention. Starting from the top of FIG. 24, an integrated circuit 2402 is housed by integrated circuit package 2406. Integrated circuit 2402 contains one or more circuits which are electrically connected to integrated circuit package 2406 by connectors (not shown).

Integrated circuit 2402 could be any of a number of types of integrated circuits. In one embodiment of the present invention, integrated circuit 2402 is a microprocessor, although integrated circuit 2402 could be other types of devices in other embodiments. In the example shown, integrated circuit 2402 is a "flip chip" type of integrated circuit, meaning that the I/O terminations on the chip can occur at any point on its surface. After the chip has been readied for attachment to integrated circuit package 2406, it is flipped over and attached, via solder bumps or balls, to matching pads on the top surface of integrated circuit package 2406.

Alternatively, integrated circuit 2402 could be a surface mount chip, where I/O terminations are connected to integrated circuit package 2406 using bond wires to pads on the top surface of integrated circuit package 2406.

Integrated circuit package 2406 is coupled to a socket 2408 on a printed circuit (PC) board 2410. In the example shown, integrated circuit package 2406 includes pins 2412 that mate with complementary pin holes in socket 2408. Alternatively, integrated circuit package 2406 could be electrically and physically connected to PC board 2410 using solder connections, such as ball grid array connections, for example, or by compression fitting package 2406 to socket 2408.

Embedded within socket 2408 are cavities with electrical contacts for housing discrete capacitors 2404, as described above. Discrete capacitors 2404 function to provide additional capacitance to integrated circuit 2402, and also to provide power dampening and noise suppression, when needed. The close proximity of these off-chip sources of capacitance means that each source has a relatively low inductance path to the integrated circuit 2402.

Socket 2408 may be a pin grid array, land grid array, or ball grid array socket. As such, in various embodiments, socket 2408 may be connected to PC board 2410 using pins, solder balls, or compression fitting, in various embodiments.

PC board 2410 could be, for example, a mother board of a computer system. As such, it acts as a vehicle to supply power, ground, and other types of signals to integrated circuit 2402. These power, ground, and other signals are supplied through traces (not shown) on PC board 2410, socket 2408, pins 2412, and traces (not shown) on or within integrated circuit package 2406.

Figure 25:
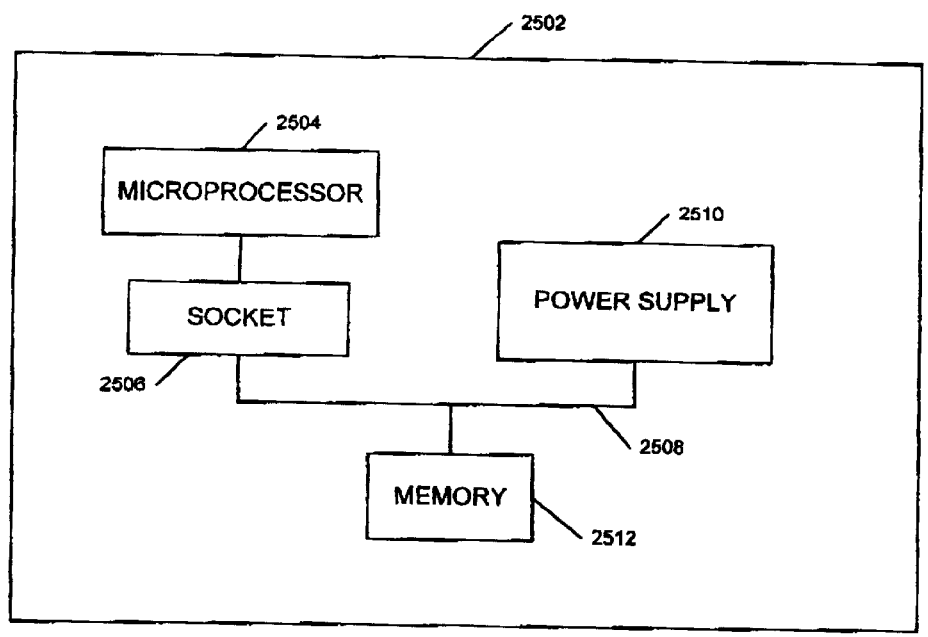
FIG. 25 illustrates a general purpose computer system in accordance with one embodiment of the present invention.

The integrated circuit socket described above in conjunction with various embodiments could be connected to a PC board forming part of a general purpose computer system. FIG. 25 illustrates a general purpose computer system 2502, which includes an integrated circuit socket 2506 and discrete capacitors or other devices in accordance with various embodiments of the present invention.

Computer system 2502 is housed on PC board and includes microprocessor 2504, package 2506, bus 2508, power supply 2510, and memory 2512. Socket 2506 includes one or more cavities and electrical contacts for housing discrete capacitors or other devices in accordance with various embodiments of the present invention, described above. Socket 2506 couples microprocessor 2504 to bus 2508 in order to communicate power supply signals and non-power supply signals between microprocessor 2504 and devices coupled to bus 2508. For the embodiment of the present invention shown in FIG. 25, bus 2508 couples microprocessor 2504 to memory 2512 and power supply 2510. However, it is to be understood that in alternative embodiments of the present invention, microprocessor 2504 can be coupled to memory 2512 and power supply signal generator 2510 through two different busses.

CONCLUSION

Thus, various embodiments of an integrated circuit socket and methods of fabricating that socket have been described, along with a description of the incorporation of such a socket on a PC board within a general purpose computer system.

While the foregoing examples of dimensions and ranges are considered typical, the various embodiments of the invention are not limited to such dimensions or ranges. It is recognized that the trend within industry is to generally reduce device dimensions for the associated cost and performance benefits. In addition, the numbers of cavities, contacts, and capacitors or other devices could be more or fewer than shown in the embodiments described above.

In the foregoing detailed description of the various embodiments, reference is made to the accompanying drawings which form a part hereof, and in which are shown by way of illustration specific embodiments in which the invention may be practiced. These embodiments are described in sufficient detail to enable those skilled in the art to practice the invention.

It will be appreciated by those of ordinary skill in the art that any arrangement which is calculated to achieve the same purpose may be substituted for the specific embodiment shown. For example, the cavities for housing the discrete devices could be located inside or outside the I/O ring. In addition, the discrete capacitors could provide capacitance to other than an integrated circuit. For example, the capacitors could provide capacitance to a circuit comprised of one or more discrete devices. In addition, additional layers of patterned conductive materials and interconnects for carrying signals, power, and ground may exist between, above, or below the layers shown in the figures.

The various embodiments, above, have been described in the context of providing off-chip capacitance to a die. One of ordinary skill in the art would understand, based on the description herein, that the method and apparatus of the present invention could also be applied in other applications where a discrete device other than a capacitor is desired in close proximity to a particular load or circuit. For example, although the various embodiments have been described as a cavity with electrical contacts for housing a discrete capacitor, the apparatus of the present invention also could be used to house discrete resistors, inductors, transistors, memory devices, and other devices, in various embodiments. Therefore, all such applications are intended to fall within the spirit and scope of the present invention.

This application is intended to cover any adaptations or variations of the present invention. The foregoing detailed description is, therefore, not to be taken in a limiting sense, and it will be readily understood by those skilled in the art that various other changes in the details, materials, and arrangements of the parts and steps which have been described and illustrated in order to explain the nature of this invention may be made without departing from the spirit and scope of the invention as expressed in the adjoining claims.

What is claimed is:

1. A method for fabricating an integrated circuit socket, the method comprising:

fabricating a socket layer;

forming one or more cavities in a top surface of the socket layer, wherein the one or more cavities are formed in a region over which an integrated circuit package can be placed;

connecting at least one contact to the socket layer, wherein each contact includes a first member of conductive material that extends from the top surface into a cavity of the one or more cavities, and a second member of conductive material that provides at least part of a conductive path between the first member and a conductive structure within the socket layer, wherein the first member at least partially holds in place and makes electrical contact with a discrete device inserted into the cavity by making direct contact with a terminal on a side surface of the discrete device, and wherein the second member includes a pin that inserts into a pin hole in the socket layer, and a bridge member that connects the first member to the pin, and wherein connecting the at least one contact comprises inserting the pin into the pin hole; and forming a depression in the top surface between the cavity and the pin hole, wherein the bridge member is inserted into the depression when the pin is inserted into the pin hole.

2. The method as claimed in claim 1, wherein forming the one or more cavities comprises forming one or more holes in the socket layer.

3. The method as claimed in claim 1, wherein forming the one or more cavities comprises forming one or more depressions in the top surface of the socket layer.

4. The method as claimed in claim 1, further comprising inserting the discrete device into the cavity.

5. The method as claimed in claim 4, wherein inserting the discrete device comprises inserting a discrete capacitor into the cavity.

6. The method as claimed in claim 4, further comprising attaching the integrated circuit package to the top surface of the socket, wherein the integrated circuit package at least partially holds the discrete device in place by making contact with a surface of the discrete device.

7. A method for fabricating an integrated circuit socket, the method comprising:

fabricating a socket layer;

forming one or more cavities in a top surface of the socket layer, wherein the one or more cavities are formed in a region over which an integrated circuit package can be placed; and connecting at least one contact to the socket layer, wherein each contact includes a first member of conductive material that extends from the top surface into a cavity of the one or more cavities, and a second member of conductive material that provides at least part of a conductive path between the first member and a conductive structure within the socket layer, and wherein the first member at least partially holds in place and makes electrical contact with a discrete device inserted into the cavity by making direct contact with a terminal on a side surface of the discrete device, and wherein the second member includes a bridge member connected to the first member, and wherein connecting the at least one contact comprises attaching the bridge member to a pad on the top surface of the socket layer.

8. The method as claimed in claim 7, further comprising forming a depression in the top surface of the socket layer between the cavity and the pad, wherein the bridge member is inserted into the depression when the at least one contact is attached to the pad.

9. An electrical contact for use in conjunction with an integrated circuit socket, the electrical contact comprising:

a first member of conductive material that extends from a top surface of the integrated circuit socket into a cavity formed in the top surface in a region over which an integrated circuit package can be placed; and a second member of conductive material that provides at least part of a conductive path between the first member and a conductive structure within the integrated circuit socket, wherein the first member at least partially holds in place and makes electrical contact with a discrete device inserted into the cavity by making direct contact with a terminal on a side surface of the discrete device, wherein the second member includes a bridge member connected to the first member, and wherein the electrical contact is connected to the integrated circuit socket by attaching the bridge member to a pad on the top surface of the integrated circuit socket.

10. The electrical contact as claimed in claim 9, wherein the first member includes a flange connected to an end of the first member opposite the second member, and wherein the flange is substantially parallel to a bottom surface of the discrete device, once inserted, and the flange at least partially holds the discrete device in place by making contact with the bottom surface of the discrete device.

11. The electrical contact as claimed in claim 9, wherein the first member includes a flange that is located near a top surface of the discrete device, once inserted, and wherein the flange at least partially holds the discrete device in place by making contact with a surface of the discrete device.

12. An integrated circuit socket comprising:
   a socket layer having one or more cavities formed in a region of a top surface of the socket layer over which an integrated circuit package can be placed; and
   contacts connected to the socket layer, wherein each of the contacts includes a first member of conductive material that extends from the top surface into a cavity of the one or more cavities, and a second member of conductive material that provides at least part of a conductive path between the first member and at least one level of the one or more levels of conductive material within the integrated circuit socket, and wherein the first member at least partially holds in place and makes electrical contact with a discrete device inserted into the cavity by making direct contact with a terminal on a side surface of the discrete device, and wherein the second member includes a bridge member connected to the first member, and wherein connecting the contacts comprises attaching the bridge member to a pad on the top surface of the socket layer.

13. An integrated circuit socket and package comprising:
   a socket having multiple cavities formed in a region of a top surface of the socket over which an integrated circuit package can be placed;
   contacts connected to the socket, wherein each of the contacts includes a first member of conductive material that extends from the top surface into a cavity of the one or more cavities, and a second member of conductive material that provides at least part of a conductive path between the first member and a conductive structure within the socket, and wherein the first member at least partially holds in place and makes electrical contact with a discrete capacitor inserted into the cavity by making direct contact with a terminal on a side surface of the discrete capacitor;
   multiple discrete capacitors inserted into the multiple cavities; and
   the integrated circuit package, electrically and mechanically attached to the top surface of the socket over the region, wherein the integrated circuit package at least partially holds in place the multiple discrete capacitors.

14. The integrated circuit socket and package as claimed in claim 13, wherein the second member includes a pin that inserts into a pin hole in the socket, and a bridge member that connects the first member to the pin, and wherein connecting the contacts comprises inserting the pin into the pin hole.

15. The integrated circuit socket and package as claimed in claim 13, wherein the second member includes a bridge member connected to the first member, and wherein connecting the contacts comprises attaching the bridge member to a pad on the top surface of the socket.

* * * * *